United States Patent
Shkolnikov et al.

(10) Patent No.: US 12,263,484 B2
(45) Date of Patent: *Apr. 1, 2025

(54) MICROFLUIDIC DEVICES

(71) Applicant: Hewlett-Packard Development Company, L.P., Spring, TX (US)

(72) Inventors: Viktor Shkolnikov, Palo Alto, CA (US); Michael W. Cumbie, Corvallis, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 174 days.

This patent is subject to a terminal disclaimer.

(21) Appl. No.: 18/102,412

(22) Filed: Jan. 27, 2023

(65) Prior Publication Data

US 2023/0173495 A1 Jun. 8, 2023

Related U.S. Application Data

(63) Continuation of application No. 16/605,675, filed as application No. PCT/US2017/059118 on Oct. 30, 2017, now Pat. No. 11,583,861.

(51) Int. Cl.
*B01L 3/00* (2006.01)

(52) U.S. Cl.
CPC ......... *B01L 3/523* (2013.01); *B01L 3/502715* (2013.01); *B01L 2200/027* (2013.01);
(Continued)

(58) Field of Classification Search
CPC ............... B01L 3/523; B01L 3/502715; B01L 2200/027; B01L 2200/16; B01L 2300/041;
(Continued)

(56) References Cited

U.S. PATENT DOCUMENTS

| 4,526,474 A | 7/1985 | Simon |
| 6,620,380 B2 | 9/2003 | Thomas et al. |

(Continued)

FOREIGN PATENT DOCUMENTS

| GB | 2501179 A | 10/2013 |
| RU | 2587628 C1 | 6/2016 |
| WO | 2013/134745 A1 | 9/2013 |

OTHER PUBLICATIONS

English translation and summary of "Solenoid valves VG for gas. Technical information. 3rd edition. Jun. 2013", 3 pages.
(Continued)

*Primary Examiner* — Matthew D Krcha
*Assistant Examiner* — Sophia Y Lyle
(74) *Attorney, Agent, or Firm* — Foley & Lardner LLP (57) ABSTRACT

In an example implementation, a reagent storage system for a microfluidic device includes a microfluidic chamber formed in a microfluidic device. A blister pack to store a reagent includes an electrically conductive membrane barrier adjacent to the chamber. A thinned region is formed in the membrane barrier, and a conductive trace is to supply electric current to heat and melt the thinned region. Melting the thinned region is to cause the membrane barrier to open and release the reagent into the chamber.

20 Claims, 4 Drawing Sheets

(52) U.S. Cl.
CPC ..... *B01L 2200/16* (2013.01); *B01L 2300/041* (2013.01); *B01L 2300/12* (2013.01); *B01L 2300/16* (2013.01); *B01L 2300/168* (2013.01); *B01L 2300/1805* (2013.01)

(58) Field of Classification Search
CPC ............. B01L 2300/12; B01L 2300/16; B01L 2300/168; B01L 2300/1805; B01L 2300/1827; B01L 2400/0677; B81B 2201/058; B81B 7/0061
See application file for complete search history.

(56) References Cited

U.S. PATENT DOCUMENTS

| | | |
|---|---|---|
| 7,429,127 B2 | 9/2008 | Walker et al. |
| 8,506,908 B2 | 8/2013 | Benn et al. |
| 2003/0133833 A1* | 7/2003 | Thomas ............... C01B 11/022 422/305 |
| 2004/0106914 A1* | 6/2004 | Coppeta ............ A61M 37/0015 604/892.1 |
| 2004/0137605 A1 | 7/2004 | McGarry et al. |
| 2005/0241983 A1 | 11/2005 | Snyder et al. |
| 2007/0299385 A1* | 12/2007 | Santini ................ A61K 9/0097 422/417 |
| 2008/0217246 A1* | 9/2008 | Benn ................ G01N 35/00029 422/63 |
| 2012/0251410 A1 | 10/2012 | Mora-Fillat |
| 2015/0167863 A1 | 6/2015 | Mescher et al. |
| 2016/0319944 A1 | 11/2016 | Ichiki et al. |
| 2017/0165151 A1 | 6/2017 | Schmid et al. |
| 2017/0244121 A1 | 8/2017 | Elliott |

OTHER PUBLICATIONS

"Blister Solution", thinXXS, 2014, retrieved from: https://web.archive.org/web/20170822175850/http://www.thinxxs.com:80/main/produkte/microfluidixxs/blister-on-a-chip.html, retrieved on Sep. 26, 2017, pp. 2.

"Topas Advanced POlymers Topas (R) 8007s-04 Cyclic Olefin Copolymer (COC)", MatWeb, obtained from Wayback Machine: https://web.archive.org/web/20150930233509/https://www.matweb.com/search/datasheettext.aspx?matguid=f0f5d6ce6f804dae9b2403f539303fb6, retrieved on: Nov. 2, 2021, pp. 2.

3neicrpomarximibie xnanatibi AAA rasa VG. paragraph "flpimulin pa6oni", 3 peaalau4si Jun. 2013, p. 6, [online] [retrieved on May 30, 2018] Retrieved from Internet: non-official translation (Gas solenoid valves VG, Operation principle, 3 edition).

English translation and summary of "Solenoid valves VG for gas. Technical information. 3rd edition. Jun. 2013", 3 pages, 2013.

* cited by examiner

MICROFLUIDIC DEVICES

CROSS-REFERENCE TO RELATED PATENT APPLICATIONS

This application is a Continuation of U.S. National Stage Application under 35 U.S.C. 371 application Ser. No. 16/605,675, filed Oct. 16, 2019 that claims priority of International Patent Application No. PCT/US2017/059118, filed Oct. 30, 2017, which are incorporated by reference herein in their entireties.

BACKGROUND

Lab-on-a-chip (LOC) devices enable the scaling down of laboratory functions to a miniaturized environment. The implementation of LOC devices involves the integration of a variety of components into a very small form factor. While research using LOC devices often focuses on human diagnostics and DNA analysis, LOC devices are applicable for laboratory analysis in a variety of technological fields including chemical analysis, environmental monitoring, medical diagnostics, pharmaceutical testing, and so on. LOC devices enable multiple analyses to be performed on a single chip using very small volumes of fluid. The use of LOC devices can improve diagnostic and analytical outcomes and reduce costs associated, for example, with reduced sample volumes, parallel analysis of different samples, reduced human error, faster response times, ease of use, compactness, expendability, and so on.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Lab-on-a-chip (LOC) devices are used in different life science and other industries for a variety of purposes such as biomedical diagnostics, drug development, and DNA replication, for example. Laboratory functions performed on LOC devices often rely on different fluid sample preparations. Preparing samples can involve the mixing of fluids, the filtering of fluids, the heating of fluids, combinations thereof, and so on. Microfluidics involves the manipulation and control of such fluids within the miniaturized LOC environments through the integration and implementation of a variety of components into a very small form factor. Such components can include, for example, integrated pumps, electrodes, valves, electronics, and blister packs to store reagents and other solutions.

Disposable microfluidic LOC devices increasingly implement on-board reservoirs to store reagents, buffers or other solutions directly on the microfluidic device to enable point-of-care microfluidic functions such as mixing, manipulation and analysis of chemical, biological and/or physical materials. Such reservoirs are often referred to as blister packs as they can form bump-like features on a microfluidic device that resemble blisters. In general, the implementation of blister packs in microfluidic devices helps to reduce costs, for example, by lowering reagent consumption, reducing sample volumes, improving response times, enhancing safety when using biological and other potentially hazardous materials, reducing device manufacturing complexities, and so on.

However, current blister pack designs can have different physical and operational features that tend to increase costs and hinder performance. For example, most blister packs that store reagents can occupy large areas on a chip or microfluidic device. This means that a microfluidic device or chip can end up being much larger than it would otherwise be to perform microfluidic operations without the reagent storage. In addition, most blister packs are designed to be opened either manually by a user, or mechanically with a plunger or other mechanism. Manually opening a blister pack can introduce variability and user error. The use of mechanical plungers or other such mechanisms to open blister packs on microfluidic devices consumes large amounts of space on microfluidic device readers.

The mechanical plungers used for opening blister packs are not located on the microfluidic device itself, but are instead integrated into the microfluidic LOC device reader. Microfluidic LOC device readers generally comprise a user interface, a power supply, a mounting station to mount microfluidic LOC devices, a controller, a substance-reading component, and other components that facilitate the functions of the microfluidic LOC device and the monitoring and analysis associated with those functions. Because the mechanical plungers tend to be bulky and costly, the number of blister packs that can be placed on each microfluidic LOC device can be further limited. Thus, the large size of mechanical plungers and current blister packs effectively reduces the number of reagents that can be stored on a microfluidic chip, which in turn, can decrease the number and complexity of operations that can be performed on the microfluidic chip.

Accordingly, example microfluidic devices and related methods described herein enable reagent storage systems that can be electrically opened or actuated in a manner that leverages existing electrical infrastructure within microfluidic device readers. An example reagent storage system may be alternately referred to herein as a blister pack, a reagent storage chamber and the like. In some examples, a blister pack can be oriented on a microfluidic device adjacent to a microfluidic chamber or channel located within the microfluidic device. The blister pack can include two films or membranes with the cavity of the blister pack formed in between. A lower membrane can be adjacent to the microfluidic device chamber and comprises an electrically conductive membrane that forms a barrier between the blister cavity and the microfluidic device chamber. The conductive membrane barrier comprises a variable cross section that includes thinned regions. The thinned regions are designed to restrict the flow of electric current which can generate heat that melts the thinned regions when electric current flows through the conductive membrane. The terms melt and melting as generally used throughout this description, are intended to indicate any type of destruction, disintegration, sublimation, oxidation, burning, or other dissolution of thinned membrane regions due to a flow of electric current through the thinned membrane regions.

An example blister pack can include an electrically conductive trace to supply electric current through the lower conductive membrane of the blister pack. As noted above, the electric current can generate heat as it passes through the thinned membrane region or regions which can melt or disintegrate the thinned regions. When a thinned region is melted away or otherwise disintegrated, the lower conductive membrane barrier adjacent to the microfluidic chamber can open up and release the stored reagent into the microfluidic chamber.

The example electrically actuated blister cavities described herein leverage existing electronics that are, in general, already designed within microfluidic LOC devices. In addition, microfluidic device readers are generally equipped with a power source and circuitry to supply the electrical current for opening the blister cavities. Thus, the electrically actuated blister cavities help to avoid costs associated with having to integrate bulky mechanical and pneumatic actuators within microfluidic device readers. Furthermore, electrical actuation allows for better scaling of the blister cavities which enables the blister cavities to contain less reagent, reducing the costs of expensive reagents. The smaller physical footprint of the electrically actuated blister cavities enables increased numbers of the blister cavities to be implemented on a single microfluidic device.

In a particular example, a reagent storage system for a microfluidic device includes a microfluidic chamber formed in a microfluidic device. A blister pack to store a reagent includes an electrically conductive membrane barrier adjacent to the chamber. A thinned region is formed in the membrane barrier, and a conductive trace is to supply electric current to heat and melt the thinned region. Melting the thinned region is to cause the membrane barrier to open and release the reagent into the chamber.

In another example, a blister pack in a microfluidic device includes a blister cavity for storing a reagent. The blister pack comprises an electrically conductive membrane as a barrier between the blister cavity and a chamber of the microfluidic device. A top membrane of the blister pack is to cover the electrically conductive membrane and enclose the blister cavity, and a conductive trace is to supply electrical current to open the electrically conductive membrane and release the reagent from the blister cavity into the chamber of the microfluidic device.

In another example, a method of mixing a reagent in a microfluidic device includes providing a mixing chamber in a microfluidic device and storing a reagent in a blister pack, where the blister pack comprises an electrically conductive membrane between the reagent and the mixing chamber. The method includes forming a thinned region in the conductive membrane and coupling a conductive trace to the conductive membrane to enable electric current to pass through and melt the thinned region to open the conductive membrane and release the reagent from the blister pack into the mixing chamber.

Figure 1:
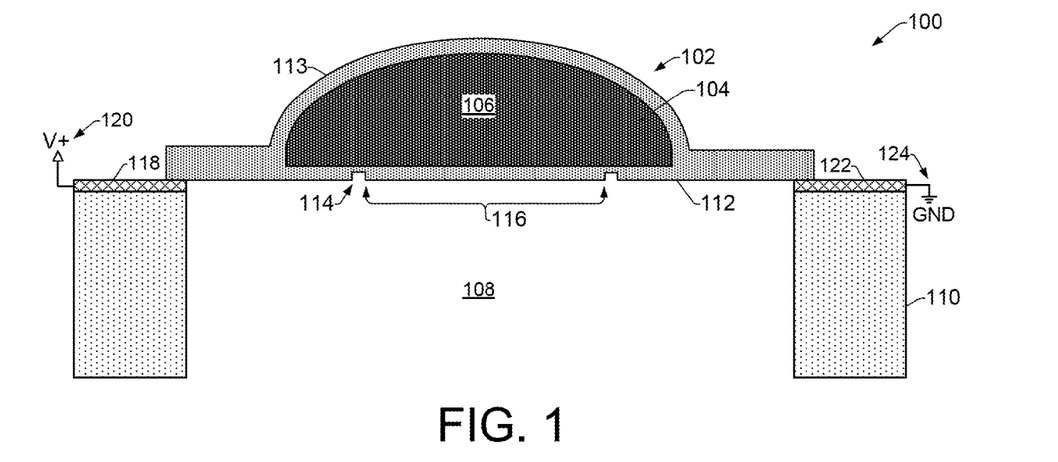
FIG. 1 shows a cross sectional side view of a portion of an example microfluidic device in which an example reagent storage blister pack can be implemented.

FIG. 1 shows a cross sectional side view of a portion of an example microfluidic device 100 in which an example reagent storage blister pack 102 can be implemented. An example blister pack 102 can store a reagent substance 104 (e.g., reagent fluid) in a blister cavity 106. The blister pack 102 can be controlled to release the reagent 104 into a chamber 108, cavity, or channel, of the microfluidic device 100 through electrical actuation. The blister pack 102 can be integrated onto the microfluidic device 100 at a location that is adjacent to a microfluidic chamber 108 or channel of the microfluidic device 100.

The example microfluidic device 100 can include one or multiple microfluidic layers, such as layer 110. In some examples, multiple layers can be formed adjacent to one another with the layers stacked, one on top of the other. As shown in FIG. 1, a microfluidic layer 110 can comprise a microfluidic chamber 108 to receive reagent 104 from an adjacent blister pack 102 upon actuation or opening of the blister pack 102. In different examples, a microfluidic chamber 108 can comprise a mixing chamber containing a sample or some other substance, a microfluidic channel having a fluid sample or other fluid substance flowing through it, or some other similar cavity to receive reagent 104 when the blister pack 102 is electrically opened, as shown in FIG. 2.

Fabrication techniques and materials used in forming such microfluidic devices 100 are generally understood and are therefore not described in detail herein. Briefly, however, some of the techniques for forming such microfluidic devices can include, for example, wet or dry etching of silicon or glass microfluidic chips, thermoforming techniques such as hot-roll embossing and injection molding, polymer casting using lithographic processes, and techniques using micro-machines and/or lasers.

Referring still to FIG. 1, an example blister pack 102 can comprise a one-time openable, conductive membrane 112 that serves as a barrier between the blister cavity 106 and the microfluidic chamber 108. An example blister pack 102 also includes a second membrane that forms a top or a covering 113 to enclose a blister cavity 106 of the blister pack 102. The blister cavity 106 can be formed between the conductive membrane 112 and the top cover membrane 113 when the conductive membrane 112 and top membrane 113 are sealed together. The blister pack 102 is operational in a first or closed state, to store a reagent 104 when the conductive membrane 112 remains intact. In a second or opened state, the conductive membrane 112 is opened to deliver or release the stored reagent 104 into the microfluidic chamber 108.

Figure 2:
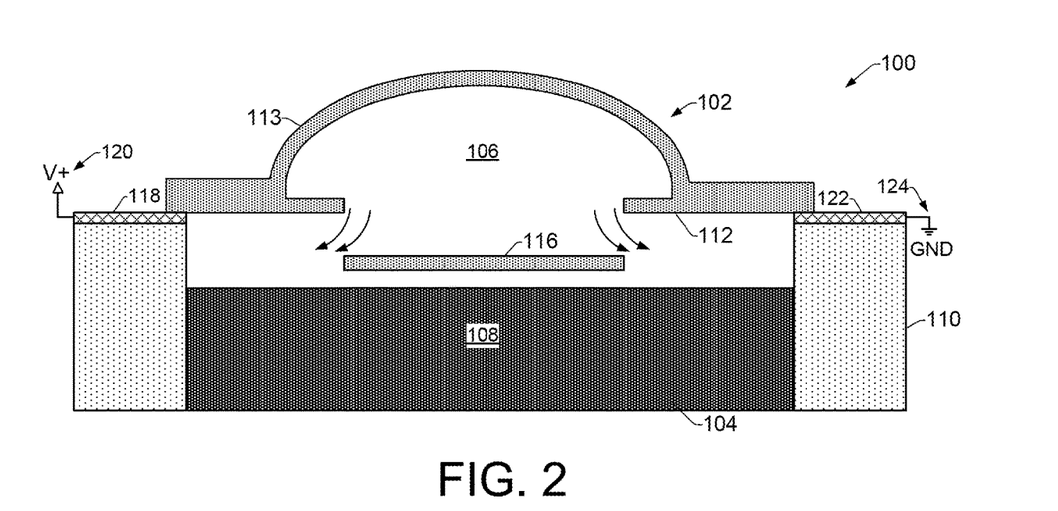
FIG. 2 shows an example microfluidic device after thinned cross section regions formed in the conductive membrane of a blister pack have been disintegrated or melted away due to heat generated by the flow of electrical current through the conductive membrane.

Referring generally to FIGS. 1 and 2, the conductive membrane barrier 112 of an example blister pack 102 comprises a variable cross section area that includes at least one thinned cross section region 114. Thinned regions 114 can be formed, for example, by scoring or stamping. The thinned regions 114 are designed to restrict the flow of electric current through the conductive membrane 112. Restriction of the current flow by the thinned regions 114 of conductive membrane 112 generates heat in the thinned regions 114 that melts or disintegrates the thinned regions 114, resulting in the opening of the membrane 112. As shown in FIG. 2, for example, the application of electric current across an example conductive membrane 112 has melted thinned regions 114 and opened a gated section 116 of the membrane 112.

FIG. 2 shows the example microfluidic device 100 of FIG. 1 after thinned cross section regions 114 formed in the conductive membrane 112 of a blister pack 102 have been disintegrated or melted away due to heat generated by the flow of electrical current through the conductive membrane 112. Disintegration of the thinned cross section regions 114 can cause a corresponding gate section 116 of the conductive membrane 112 to become separated from a portion of the conductive membrane 112 that remains in place on the microfluidic device. The separation or opening of the gate section 116 effectively punctures or opens the blister pack 102 and allows the reagent 104 stored in the blister cavity 106 to release into the adjacent microfluidic chamber 108.

The conductive membrane 112 of an example blister pack 102 can be coupled to at least one source electrode 118 which can be connected to a source voltage 120, and at least one sink electrode 122 coupled to a ground 124. Connections to a source voltage 120 and a ground 124 can be made, for example, when the microfluidic device 100 is mounted in a device reader such as the device reader 132 discussed below with reference to FIG. 5. The electrodes 118, 122, enable electric current to flow through the conductive membrane 112 and thinned cross section regions 114, causing the thinned regions 114 to melt and open the gate section 116 of the conductive membrane 112.

In some examples, electric current applied to heat and melt thinned regions 114 of a blister pack 102 conductive membrane 112 can be applied as a current pulse through the conductive membrane 112. In some examples, a current pulse provided to open the conductive membrane 112 can have a duration that lasts less than or on the order of 0.01L2/D, where L comprises a radius of the blister pack 102 and D comprises the thermal diffusivity of an aqueous reagent stored within the blister cavity 106. A current pulse less than or on the order of 0.01L2/D can help to minimize the penetration of thermal energy into the reagent. In a particular example, using an aqueous based reagent fluid and a blister pack comprising a radius on the order of 1 mm, the duration of the current pulse can be on the order of 70 ms (milliseconds).

An example conductive membrane 112 of an example blister pack 102 comprises, for example, a metalized plastic film or membrane that can be formed of multiple layers. In some examples, the conductive membrane 112 can include a first metal outer layer and a second metal outer layer with a third plastic inner layer sandwiched in between the outer layers. In some examples, the conductive membrane 112 can comprise two layers that include a single metal layer sandwiched against a plastic layer. Some examples of metals that can be used in a conductive membrane 112 include, but are not limited to, nickel, chromium, aluminum, alloys thereof, and so on. Some examples of plastics that can be used in a conductive membrane 112 include, but are not limited to, nylon, polyethylene, polypropylene, and polyethylene terephthalate. In some examples, the conductive membrane 112 comprises an inert material coating to prevent chemical interaction between the stored reagent and a material of the membrane barrier. Examples of inert material coatings can include, but are not limited to, Au, Pt, SiO2, parlene (Poly-Para-Xylylene), silicones, polyurethanes, fluorinated ethylene-propylene, and so on.

Figure 3:
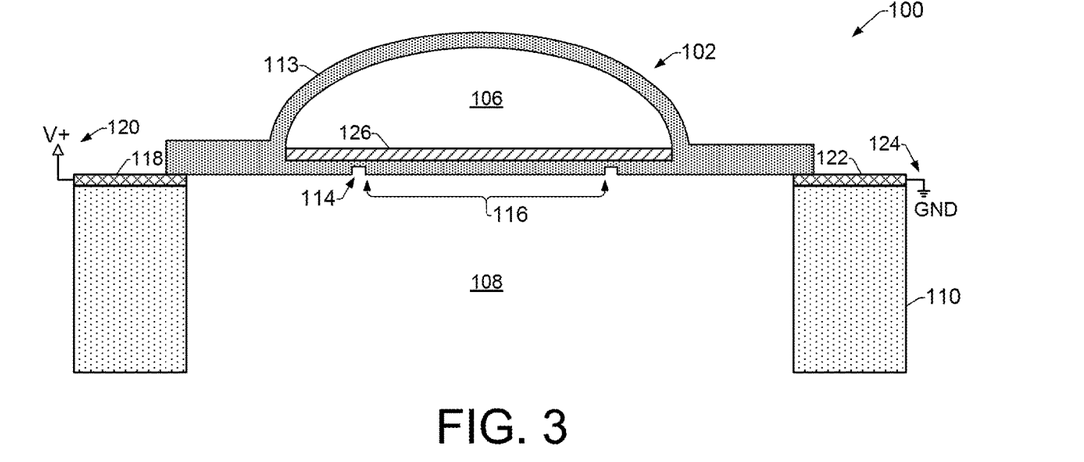
FIG. 3 shows an example microfluidic device with an example blister pack that comprises a thermal insulation membrane within the blister pack.

FIG. 3 shows an example microfluidic device 100 with an example blister pack 102 that comprises a thermal insulation membrane/layer 126 within the blister pack 102. The thermal insulation layer 126 can be adjacent to the conductive membrane 112 and can isolate the conductive membrane 112 from having direct contact with the reagent being stored within the blister cavity 106. The thermal insulation layer 126 can help to concentrate heat within the thinned regions 114 of the conductive membrane 112 and reduce heat transfer from the thinned regions 114 into the reagent.

Figure 4:
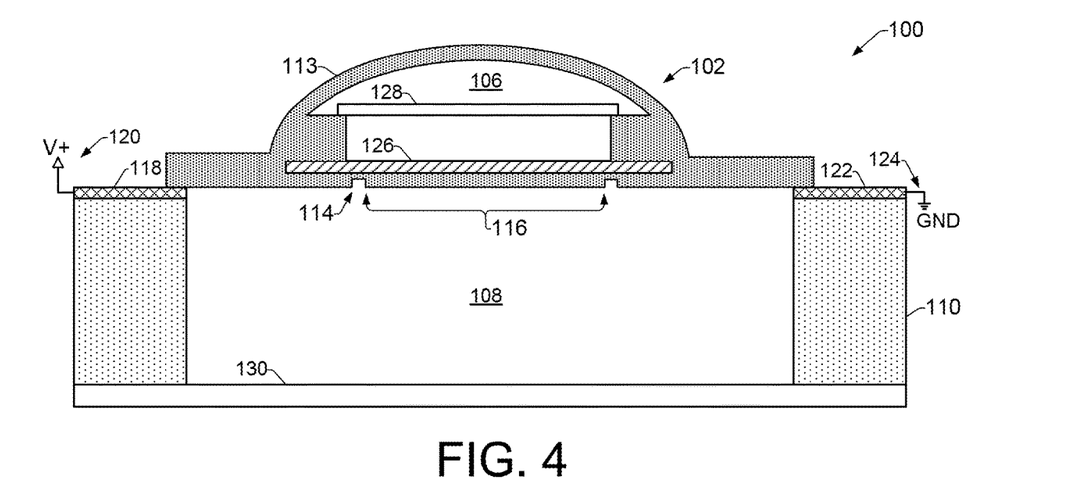
FIG. 4 shows an example microfluidic device with an example blister pack that comprises a sensor substrate within the blister cavity.

FIG. 4 shows an example microfluidic device 100 with an example blister pack 102 that comprises a sensor substrate 128 within the blister cavity 106. In some examples, the sensor substrate 128 may be suitable for use in a SERS (Surface Enhanced Raman Spectroscopy) sensing technique, for example, to detect the presence of a particular analyte, toxin, contaminant, or other substance of interest within the reagent stored in the blister cavity 106. In such examples, an example microfluidic device 100 can additionally comprise an optically transparent chamber covering 130 to enable an optical sensor to sense the sensor substrate through the chamber 108 of the microfluidic device 100.

Figure 5:
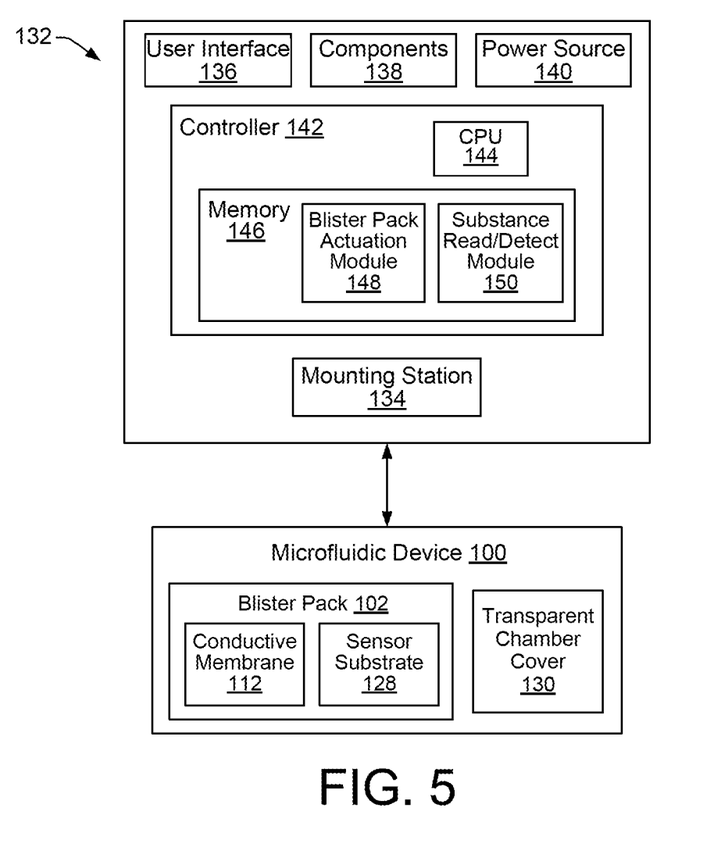
FIG. 5 shows an example of a microfluidic device reader suitable to receive a microfluidic device comprising an electrically actuatable blister pack, and to provide electric current to controllably actuate, or open, the blister pack to enable the release or disbursement of reagent stored within the blister pack; and, FIG. 6 shows a flow diagram of an example method of mixing a reagent in a microfluidic device.

FIG. 5 shows an example of a microfluidic device reader 132 suitable to receive a microfluidic device 100 comprising an electrically actuatable blister pack 102, and to provide electric current (i.e., voltage source 120, ground 124) to controllably actuate, or open, the blister pack 102 to enable the release or disbursement of reagent stored within the blister pack 102. As discussed above, an example microfluidic device 100 can comprise a blister pack 102 that includes, for example, an electrically conductive membrane 112 and a sensor substrate 128 to facilitate SERS sensing. The microfluidic device 100 can additionally include a transparent chamber covering 130 to enable the use of substance reading components on the microfluidic device reader 132.

The microfluidic device reader 132 can include a mounting station 134 for receiving a microfluidic device 100, a user interface 136 such as a touch-sensitive display screen, substance reading components 138, a power source 140, and a controller 142. Substance reading components 138 can include, for example, a light source, and a photodetector and/or spectrometer to facilitate an analysis of samples, reagent fluids and other substances during a substance detection process such as a SERS substance detection process.

As shown in FIG. 5, an example controller 142 can include a processor (CPU) 144 and a memory 146. The controller 142 may additionally include other electronics (not shown) for communicating with and controlling various components of the device reader 132. Such other electronics can include, for example, discrete electronic components and/or an ASIC (application specific integrated circuit). Memory 146 can include both volatile (i.e., RAM) and nonvolatile memory components (e.g., ROM, hard disk, optical disc, CD-ROM, magnetic tape, flash memory, etc.). The components of memory 146 comprise non-transitory, machine-readable (e.g., computer/processor-readable) media that can provide for the storage of machine-readable coded program instructions, data structures, program instruction modules, and other data and/or instructions executable by a processor 144 of the device reader 132.

An example of executable instructions to be stored in memory 146 include instructions associated with modules 148 and 150. In general, modules 148 and 150 include programming instructions and/or data executable by processor 144 to cause the device reader 132 to perform operations related to actuating or opening electrically conductive membranes 112 on a microfluidic device 100, and to detect, read, and analyze substances on such microfluidic devices 100. For example, the blister pack actuation module 148 can include executable instructions that cause the device reader 132 to provide pulses of electric current through electrodes to different conductive membranes 112 of a microfluidic device 100, as discussed above with reference to FIGS. 1-4. Similarly, the substance reading and detection module 150 can include executable instructions that cause the device reader 132 to control a light source and a spectrometer to facilitate an analysis of reagent fluids or other substances during a substance detection process such as a SERS substance detection process.

Figure 6:
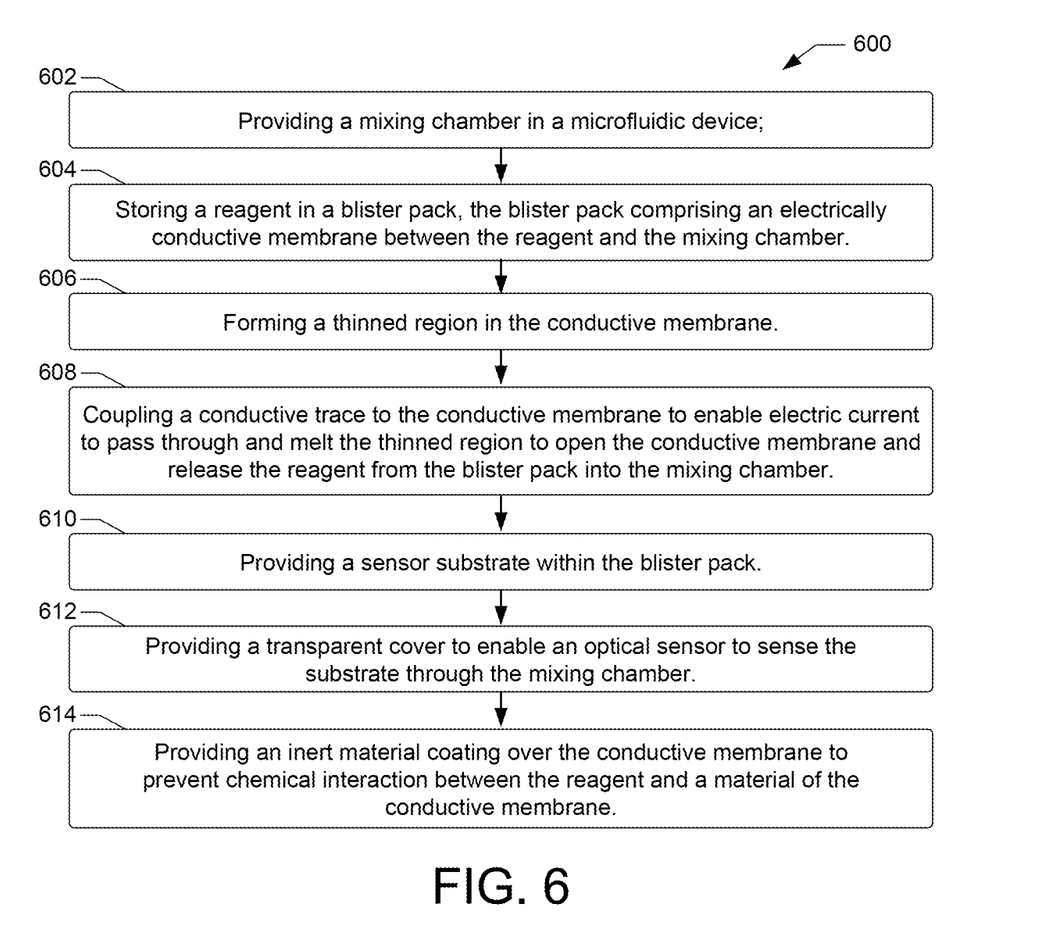

FIG. 6 shows a flow diagram of an example method 600 of mixing a reagent in a microfluidic device. The example method 600 is associated with examples discussed above with respect to FIGS. 1-5, and details of the operations shown in method 600 can be found in the related discussion of such examples. The method 600 may include more than one implementation, and different implementations of method 600 may not employ every operation presented in the flow diagram of FIG. 6. Therefore, while the operations of method 600 are presented in a particular order within the flow diagram, the order of their presentation is not intended to be a limitation as to the order in which the operations may actually be implemented, or as to whether all of the operations may be implemented. For example, one implementation of method 600 might be achieved through the performance of a number of initial operations, without performing some subsequent operations, while another implementation of method 600 might be achieved through the performance of all of the operations.

Referring now to the flow diagram of FIG. 6, an example method of mixing a reagent in a microfluidic device begins at block 602 with providing a mixing chamber in a microfluidic device. The method 600 also includes storing a reagent in a blister pack as shown at block 604. The blister pack comprises an electrically conductive membrane between the reagent and the mixing chamber. As shown at block 606, the method includes forming a thinned region in the conductive membrane. A conductive trace can be coupled to the conductive membrane to enable electric current to pass through and melt the thinned region, as shown at block 608. Melting or disintegrating the thinned region is to open the conductive membrane and release the reagent from the blister pack into the mixing chamber. As shown at blocks 610 and 612, respectively, the method can further include providing a sensor substrate within the blister pack, and providing a transparent cover to enable an optical sensor to sense the substrate through the mixing chamber. In some examples, the method 600 can include providing an inert material coating over the conductive membrane to prevent chemical interaction between the reagent and a material of the conductive membrane, as shown at block 614.

What is claimed is:

1. A system comprising:
   a blister pack comprising a blister cavity to store a reagent; and
   an electrically conductive membrane barrier that releases the reagent from the blister cavity upon application of an electric current to the membrane barrier, the membrane barrier comprising:
      a thinned region to generate heat and melt when restricting electric current flow of the electric current through the membrane barrier;
      a remaining portion that remains when the reagent is released from the blister cavity upon application of the electric current to the membrane barrier; and
      a separable gate section defined by the thinned region and separable from the remaining portion of the membrane barrier at the thinned region when the thinned region melts.

2. The system of claim 1, further comprising a microfluidic chamber, wherein the membrane barrier is positioned adjacent to the microfluidic chamber and between the reagent and the microfluidic chamber.

3. The system of claim 2, wherein the reagent releases into the microfluidic chamber upon melting of the thinned region.

4. The system of claim 1, further comprising a thermal insulation layer positioned adjacent to and between the reagent and the thinned region of the membrane barrier.

5. The system of claim 1, further comprising a conductive trace to supply the electric current to the membrane barrier.

6. The system of claim 5, wherein the conductive trace comprises:
   a source electrode coupled to a first side of the membrane barrier; and
   a sink electrode coupled to a second side of the membrane barrier.

7. The system of claim 1, further comprising a sensor substrate within the blister pack.

8. The system of claim 7, further comprising a microfluidic chamber adjacent to the membrane barrier, and a transparent cover to enable an optical sensor to sense the sensor substrate through the microfluidic chamber.

9. The system of claim 1, wherein the membrane barrier comprises a metalized plastic membrane comprising:
   a first metal membrane;
   a second metal membrane; and
   a plastic membrane sandwiched between the first and second metal membranes.

10. The system of claim 1, further comprising a second membrane to enclose the blister cavity, the blister cavity formed between the membrane barrier and the second membrane.

11. The system of claim 1, wherein the membrane barrier is configured to release the reagent upon application of a current pulse of the electric current with a duration less than $0.01 L^2/D$, where L comprises a radius of the blister pack and D comprises the thermal diffusivity of the reagent.

12. The system of claim 11, wherein the blister pack comprises a radius on the order of 1 mm, and the duration of the current pulse is on the order of 70 ms.

13. The system of claim 1, wherein the membrane barrier comprises an inert material coating to prevent chemical interaction between the reagent and a material of the membrane barrier.

14. The system of claim 13, wherein the inert material coating is selected from the group consisting of Au, Pt, $SiO_2$, parlene (Poly-Para-Xylylene), silicones, polyurethanes, and fluorinated ethylene-propylene.

15. A system comprising:
   a chamber;
   a blister pack to store a reagent; and
   an electrically conductive membrane barrier positioned between the reagent and the chamber, the membrane barrier comprising:
      a current-restricting, meltable thinned region to generate heat and melt upon application of an electric current to the membrane barrier;
      a remaining portion that remains in place when the thinned region melts; and
      a separable gate section separable from the remaining portion of the membrane barrier at the thinned region when the thinned region melts;
   wherein the reagent releases into the chamber upon melting of the thinned region from the application of the electric current to the membrane barrier.

16. The system of claim 15, further comprising a conductive trace to supply the electric current to the membrane barrier.

17. The system of claim 15, wherein the membrane barrier is positioned adjacent to the chamber and between the reagent and the chamber.

18. The system of claim 15, further comprising a microfluidic device, wherein the chamber is formed in the microfluidic device.

19. The system of claim 15, further comprising:
   a sensor substrate within the blister pack; and
   a transparent cover to enable an optical sensor to sense the sensor substrate through the chamber.

20. The system of claim 15, wherein the membrane barrier comprises a metalized plastic membrane comprising:
   a first metal membrane;
   a second metal membrane; and
   a plastic membrane sandwiched between the first and second metal membranes.

* * * * *